US007298143B2

(12) United States Patent
Jaermann et al.

(10) Patent No.: US 7,298,143 B2
(45) Date of Patent: Nov. 20, 2007

(54) REDUCTION OF SUSCEPTIBILITY ARTIFACTS IN SUBENCODED SINGLE-SHOT MAGNETIC RESONANCE IMAGING

(75) Inventors: Thomas Jaermann, Zurich (CH); Klaas Paul Pruessmann, Zurich (CH); Markus Weiger, Kressbonn (DE); Conny Frauke Schmidt, Zurich (CH); Peter Boesiger, Ennetbaden (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/514,355

(22) PCT Filed: May 8, 2003

(86) PCT No.: PCT/CH03/01925

§ 371 (c)(1),
(2), (4) Date: Nov. 12, 2004

(87) PCT Pub. No.: WO03/096045

PCT Pub. Date: Nov. 20, 2003

(65) Prior Publication Data

US 2005/0212517 A1    Sep. 29, 2005

(30) Foreign Application Priority Data

May 13, 2002   (EP)   .................................. 02076846

(51) Int. Cl.
*G01V 3/00*   (2006.01)

(52) U.S. Cl. ...................... 324/307; 324/309; 324/318; 600/407; 600/410

(58) Field of Classification Search ........ 600/407–423; 324/306–309, 318–322
See application file for complete search history.

(56) References Cited

U.S. PATENT DOCUMENTS

| 5,910,728 | A * | 6/1999 | Sodickson ................... 324/309 |
| 6,326,786 | B1 * | 12/2001 | Pruessmann et al. ........ 324/312 |
| 6,717,406 | B2 * | 4/2004 | Sodickson ................... 324/307 |
| 2002/0167315 | A1 * | 11/2002 | Kellman et al. ............ 324/307 |

FOREIGN PATENT DOCUMENTS

| WO | WO 98/21600 | 5/1998 |
| WO | WO 99/54746 | 10/1999 |

OTHER PUBLICATIONS

Bammer, R., et al.; Improved Diffusion-Weighted Single-Shop Echo Planar Imaging (EPI) . . . ; Magnetic Resonance in Medicine; 2001; vol. 46, No. 3, pp. 548-554.

(Continued)

*Primary Examiner*—Brian L. Casler
*Assistant Examiner*—John F. Ramirez

(57) ABSTRACT

In a magnetic resonance imaging method an echo train is generated of successive magnetic resonance signals from an object to be examined. The magnetic resonance signals are received with a degree of undersampling and by means of a receiver antennae system having a spatial sensitivity profile and the degree of undersampling is set on the basis of an amount of phase evolution due to a magnetic susceptibility distribution of the object to be examined.

6 Claims, 4 Drawing Sheets

OTHER PUBLICATIONS

Jaermann, T., et al.; Fiber Tracking Using SENSE-DTI at 3 Tesla; Int. Soc. for MR in Medicine-10th Mtg. Honolulu, HI; 2002; p. 437.

Krueger, G., et al.; Neuroimaging at 1.5T and 3.0T: Comparison of Oxygenation Sensitive MRI; Mag. Res. in Med.; vol. 45, No. 4, 2001; pp. 595-604.

Pruessmann, K.P., et al.; Sensitivity Encoding for Single-Shot Diffusion Imaging; Intl Soc for MR in Med.-7th Mtg, Phil., PA; 1999; pp. 22-28.

Pruessmann, K.P., et al.; SENSE: Sensitivity Encoding for Fast MRI; Mag. Res. in Med.; vol. 42, 1999; pp. 952-962.

Schmidt, C.F., et al.; High-Resolution fMRI Using SENSE at 3 Tesla; Intl Soc. for MR in Med-10th Mtg-Honolulu, HI; 2002; p. 125.

Weiger, M., et al.; Sensitivity Encoded Single-Shot Spiral Imaging for Reduced Susceptibility Artifacts in BOLD fMRI; Intl. Soc. for MR in Med.-10 Mtg.; 2002, p. 203.

* cited by examiner

High-resolution sshEPI | Conventional sshEPI

REDUCTION OF SUSCEPTIBILITY ARTIFACTS IN SUBENCODED SINGLE-SHOT MAGNETIC RESONANCE IMAGING

BACKGROUND

The invention relates to a magnetic resonance imaging method comprising
- applying a static main magnetic field with a main field strength and acquisition sequence with an RF-excitation which generates an echo train of successive magnetic resonance signals from an object to be examined
- receiving the magnetic resonance signals with a degree of undersampling and by means of a receiver antennae system having a spatial sensitivity profile and
- reconstructing a magnetic resonance image from the magnetic resonance signals and the spatial sensitivity profile.

Such a magnetic resonance imaging method is usually indicated as a parallel imaging method and is known from the paper by K. Pruessmann et. al. in Magn. Reson. Med. 42(1999)952-962.

The known method is in particular known as the SENSE-technique. The undersampling of the magnetic resonance signals is associated with undersampling in the k-space and reduces the time required for scanning the k-space. However, parallel imaging methods generate magnetic resonance signals that intrinsically have a relative low signal-to-noise ratio (SNR). In particular, the SNR decreases with increasing degree of undersampling.

SUMMARY

An object of the invention is to optimise the degree of undersampling such that the magnetic resonance image has a high diagnostic quality and scanning of k-space is completed in a relatively short time.

This object is achieved by the magnetic resonance imaging method according to the invention, wherein the degree of undersampling is set on the basis of an amount of phase evolution due to a magnetic susceptibility distribution of the object to be examined.

The present invention is based on the insight that the diagnostic quality of the magnetic resonance image may be compromised by susceptibility artefacts. Owing to a variance of the magnetic susceptibility in the object to be examined, excited spins in the object acquire varying phase errors during the echo train. Accordingly, the magnetic resonance signals, in particular in the form of gradient echoes, in the echo train incur phase errors that are larger for later echoes in the train. In particular, in diffusion weighted imaging a spin echo is generated which is followed by a series of gradient echos, notably these gradient echoes are sensitive for phase errors, while the spin echo is to some extent inherently corrected for phase errors. According to the invention, the degree of undersampling is chosen so small as to achieve a sufficiently low degree of undersampling so that the SNR is sufficiently high and on the other hand, the degree of undersampling is chosen sufficiently large so that the time for scanning k-space, and accordingly the duration of the echo train is sufficiently small to avoid serious phase errors to be incurred in the later portion of the echo train.

In particular the method of the invention is advantageously implemented in the form of a single-shot EPI (ssbEPI) sequence. The undersampling allows a relevant portion of k-space to be scanned using only a single RF-excitation to generate the echo train. Consequently, phase navigator gating can be avoided. Good results are achieved by employing the method of the invention to functional MRI(fMRI), such as in the context of blood oxygenation level dependent (BOLD) fMRI. To allow the BOLD effect to develop, the echo time of the magnetic resonance signals is set in a range of 30-40 ms. Particularly good results are achieved by employing a half-Fourier magnetic resonance signal acquisition which starts right after the RF-excitation pulse and reaches the centre of k-space at the set echo time.

These and other aspects of the invention will be elaborated with reference to the preferred implementations as defined in the dependent Claims.

Preferably, the degree of undersampling is chosen in dependence of the main field strength. Artefacts due to phase errors caused by susceptibility artefacts tend to increase with higher main fields strength in the range of 1.5 T to 3.0 T, 7.0 T or even higher. According to the invention the degree of undersampling is chosen such that on the one hand the echo train length is limited so as to avoid substantial phase errors and on the other hand the degree of undersampling is relatively low so that the SNR is sufficient to reconstruct the magnetic resonance image with a high diagnostic quality. Further, it has been found that the contrast-to-noise ratio of the magnetic resonance image increases at higher main field strength, e.g. at 3 T, which counteracts the drawback of decrease of SNR due to undersampling.

Preferably, the present invention is employed in diffusion weighted or diffusion tensor magnetic resonance imaging techniques. To that end the acquisition sequence includes a diffusion sensitisation sub-sequence. Such a diffusion sensitisation sub-sequence includes for example a bipolar gradient pulse pair or a gradient pulse pair separated by a refocusing RF pulse. Preferably, the diffusion sensitisation is implemented in an orientation dependent way such that the diffusion tensor elements can be derived from the magnetic resonance signals. This implementation of the invention notably allows non-invasive tracking of cortical white matter tracts in the human brain.

Parallel imaging, in particular the SENSE technique is advantageous in high-resolution fMRI, notably because the reduction of the signal acquisition time leads to a reduction in in-plane susceptibility artefacts. However, compared to fall sampling, such as full Fourier encoding, parallel imaging leads to a reduction of the signal-to-noise ratio of the fMRI images. It appears that an optimum compromise between artefact reduction and maintaining an adequate signal-to-noise level is achieved at a SENSE reduction factor R of about R=2, in particular this optimum holds for fMRI studies in medial temporal brain regions.

The present invention achieves a spatial resolution of the diffusion weighted or diffusion tensor images in the sub-millimetre region, notably for a main field strength of about 3 T. Application of parallel imaging, such as the SENSE technique, effectively reduces susceptibility artefacts and blurring. Further, the signal-to noise ratio of the undersampled magnetic resonance signals is effectiely enhanced in an optimum range of the SENSE reduction factor R, which represents the degree of undersampling. At low R, the signal-to-noise ratio increases as the number of sampled k-space profiles decreases. This is due to the mitigation of T2-decay by faster k-space sampling. At higher values of R, the signal-to-noise ratio decreases as a consequence of noise enhancement due to ill-conditioning of the reconstruction procedure; this decrease of the signal-to-noise is often represented by a so-called geometry factor.

This signal-to-noise notably decreases due to enhanced noise correlation of inductive coupled receiver antennae. In practice the optimum range of the reduction factor It is about [1.9-3.3]. The optimum value is further dependent on a degree of partial Fourier acquisition. Good results are particularly achieved when R=2.4 is combined with 60% partial Fourier acquisition. For single-shot spin echo EPI (sabSE-EPI) with a 256×256 matrix, a main field strength of 3 T a scan time as short as 3.5 mins was achieved.

Preferably, the magnetic resonance images are repeatedly acquired, for example each of the magnetic resonance signals are acquired four times and a series of repeated magnetic resonance images are reconstructed. The magnetic resonance signals are 'gated', i.e. only the magnetic resonance image that can be reliably matched are actually averaged. For example, only pairs of magnetic resonance images which match better than a predetermined critical match value are taken into account for averaging. Consequently, the averaging increases the SNR of the averaged image while due to the 'gating' hardly any or no artefacts are introduced.

The time required for acquisition of the magnetic resonance (MR) signals is reduced by employing sub-sampling of the MR-signals. Such sub-sampling involves a reduction in k-space of the number of sampled points which can be achieved in various ways. Notably, the MR signals are picked-up through signal channels pertaining to several receiver antennae, such as receiver coils, preferably surface coils. Acquisition through several signal channels enables parallel acquisition of signals so as to further reduce the signal acquisition time.

Owing to the sub-sampling, sampled data contain contributions from several positions in the object being imaged. The magnetic resonance image is reconstructed from the sub-sampled MR-signals with the use of a sensitivity profile associated with the signal channels. Notably, the sensitivity profile is for example the spatial sensitivity profile of the receiver antennae, such as receiver coils. Preferably, surface coils are employed as the receiver antennae. The reconstructed magnetic resonance image may be considered as being composed of a large number of spatial harmonic components which are associated with brightness/contrast variations at respective wavelengths. The resolution of the magnetic resonance image is determined by the smallest wavelength, that is by the highest wavenumber (k-value). The largest wavelength, i.e. the smallest wavenumber, involved, is the field-of-view (FOV) of the magnetic resonance image. The resolution is determined by the ratio of the field-of-view and the number of samples.

The sub sampling may be achieved in that respective receiver antennae acquire MR signals such that their resolution in k-space is coarser than required for the resolution of the magnetic resonance image. The smallest wavenumber sampled, i.e. the minimum step-size in k-space, is increased while the largest wavenumber sampled is maintained. Hence, The image resolution remains the same when applying sub-sampling, while the minimum k-space step increases, i.e. the FOV decreases. The sub-sampling may be achieved by reduction of the sample density in k-space, for instance by skipping lines in the scanning of k-space so that lines in k-space are scanned which are more widely separated than required for the resolution of the magnetic resonance image. The sub-sampling may be achieved by reducing the field-of-view while maintaining the largest k-value so that the number of sampled points is accordingly reduced. Owing to the reduced field-of-view sampled data contain contributions from several positions in the object being imaged.

Notably, when receiver coil images are reconstructed from sub-sampled MR-signals from respective receiver coils, such receiver coil images contain aliasing artefacts caused by the reduced field-of-view. From the receiver coil images and the sensitivity profiles the contributions in individual positions of the receiver coil images from different positions in the image are disentangled and the magnetic resonance image is reconstructed. This MR-imaging method is known as such under the acronym SENSE-method. This SENSE-method is discussed in more detail in U.S. Pat. No. 6,326,786.

Alternatively, the sub-sampled MR-signals may be combined into combined MR-signals which provide sampling of k-space corresponding to the full field-of-view. In particular, according to the so-called SMASH-method sub-sampled MR-signals approximate low-order spherical harmonics which are combined according to the sensitivity profiles. The SMASH-method is known as such from U.S. Pat. No. 5,910,728.

Sub-sampling may also be carried-out spatially. In that case the spatial resolution of the MR-signals is less than the resolution of the magnetic resonance image and MR-signals corresponding to a full resolution of the magnetic resonance image are formed on the basis of the sensitivity profile. Spatial sub-sampling is in particular achieved in that MR-signals in separate signal channels, e.g. from individual receiver coils, form a combination of contributions from several portions of the object. Such portions are for example simultaneously excited slices. Often the MR-signals in each signal channel form linear combinations of contributions from several portions, e.g. slices. This linear combination involves the sensitivity profile associated with the signal channels, i.e. of the receiver coils. Thus, the MR-signals of the respective signal channels and the MR-signals of respective portions (slices) are related by a sensitivity matrix which represents weights of the contribution of several portions of the object in the respective signal channels due to the sensitivity profile. By inversion of the sensitivity matrix, MR-signals pertaining to respective portions of the object are derived. In particular MR-signals from respective slices are derived and magnetic resonance images of these slices are reconstructed.

The invention also relates to a magnetic resonance imaging system. It is an object of the invention to provide a magnetic resonance imaging system for carrying out the magnetic resonance imaging methods according to the invention. The functions of a magnetic resonance imaging system according to the invention are preferably cried out by means of a suitably programmed computer or (micro)processor or by means of a special purpose processor provided with integrated electronic or opto-electronic circuits especially designed for the execution of one or more of the magnetic resonance imaging methods according to the invention.

The invention also relates to a computer program with instructions for executing a magnetic resonance imaging method. It is a further object of the invention to provide a computer program whereby one or more of the magnetic resonance imaging methods according to the invention can be carried out. When such a computer program according to the invention is loaded into the computer of a magnetic resonance imaging system, the magnetic resonance imaging system will be capable of executing one or mote magnetic resonance imaging methods according to the invention. For example, a magnetic resonance imaging system according to the invention is a magnetic resonance imaging system whose computer is loaded with a computer program according to the invention. Such a computer program can be stored on a cater such as a CD-ROM. The computer program is then loaded into the computer by reading the computer program from the carrier, for example by means of a CD-ROM player, and by storing the computer program in the memory of the computer of the magnetic resonance imaging system.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

Figure 1:
FIG. 1. Comparison of sshEPI-DWIs acquired with SENSE (A,C: reduction factor=3.0) and without SENSE (B,D: no reduction). Arrows indicate susceptibility artefacts on images without SENSE. Pairs of images (A-B, C-D) have exactly the same slice location.

In a preferred implementation of the present invention, sensitivity-encoding (SENSE) was used for enhancing the feasibility of high-resolution diffusion tensor imaging (DTI) at 3 Tesla. Reducing the echo train length of single-shot EPI (sshEPI), the technique mitigates susceptibility effects, addressing the key problem of DTI at high field. Based on diffusion tensor maps from healthy volunteers, fibre tracking in the frontal white matter was performed and visualised with a newly developed software package.

The study shows that SENSE permits robust single-shot DTI at 3 Tesla. The signal-to-noise ratio (SNR) benefit of high field is thus made available for fibre tracking with high spatial resolution.

Introduction

Diffusion tensor imaging (DTI) using single-shot EPI (sshEPI) enables non-invasive tracking of cortical white matter fibres in the human brain. Critical shortcomings of sshEPI are image blurring and its sensitivity to field inhomogeneity, especially at high field strengths. However, the SNR benefit of high field could considerably enhance DTI and fibre tracking.

Recently, the potential of the parallel imaging technique SENSE was demonstrated in combination with diffusion-weighted MRI using sshEPI at 1.5 Tesla. SENSE was shown to significantly reduce artefacts by shortening the EPI train. Hence, in this study we explore SENSE-DTI at 3 Tesla, making the enhanced SNR of high field available for fibre tracking in the human brain.

Resulting white matter tracts were displayed using a newly developed visualisation tool, which enables observing embedded tracts from different view-angles and viewpoints using a transparent 3D context.

Methods

Whole brain datasets of three healthy volunteers were acquired on a 3 T Philips Intera whole body system (Philips Medical Systems, Best, the Netherlands). For all SENSE acquisitions, an 8-element head coil array MRI Devices Corporation, Waukesha, USA) was utilised. 3D gradient echo images, acquired interleaved from the body coil and the SENSE coil array (matrix/α/TE=34□34/7°/17 ms/4.6 ms), served as references for sensitivity calculations; Diffusion-weighted SENSE-sshEPI scans (FOV=200 mm, 38 slices, thickness=3 mm, TR>6 s, phase enc.=AP) with SENSE reduction factors of 1.0, 2.0, 2.5 and 3.0 (TE=105 ms, 89 ms, 79 ms and 75 ms) were carried out along six directions $(-2/3 -1/30 -2/3)^T$ $(1/3 -2/3)^T$ $(-2/3\ 2/3\ 1/3)^T$ $1/\sqrt{2}(1\ 1\ 0)^T$ $1/\sqrt{2}(0-1-1)^T$ $1/\sqrt{2}(1\ 0-1)^T$ with a maximal b-factor of 1000 s/mm². In order to limit T2 decay, partial Fourier encoding of 75% was applied. After SENSE-reconstruction each slice matrix consisted of 128□103 points with an actual resolution of 1.6×1.9×3 mm³. After zero filling a resulting resolution of 1.6×1.6×3 mm³ was used for DTI calculations and fibre reconstruction. A total of 16 averages (4 scans, each≈3'30") were acquired to enhance SNR. Subsequently, a rigid interscan registration was applied and eddy-current-induced image warping was removed with a non-rigid registration algorithm. The eigenvalues and eigenvectors were determined by singular value decomposition and fibre tracking was performed using an improved version of the FACT algorithm. Resulting fibre tracts were visualised in a 3D environment with a newly developed software package taking advantage of OpenGL.

Results

Figure 2:
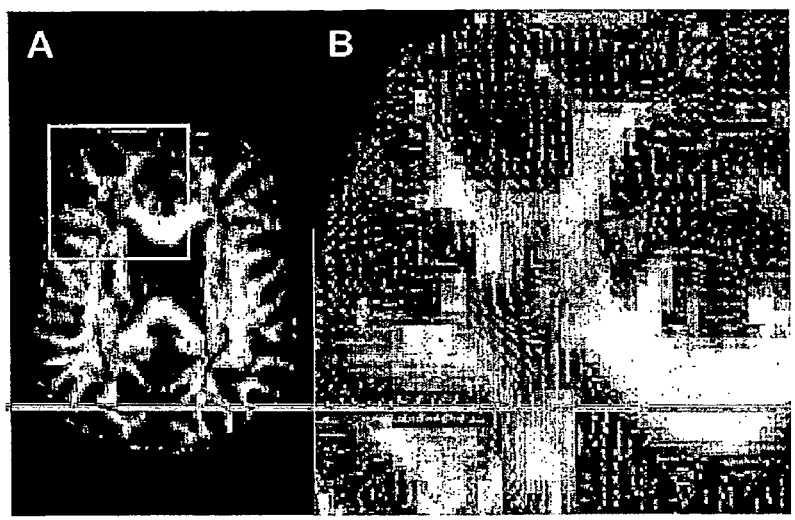
FIG. 2. A: High SNR 3 T FA map with region of interest (white rectangle). B: Vector map of the zoomed ROI, overlaid onto an FA map.
Figure 3:
FIG. 3. A: 3D-rendering of one subject's brain, depicting forceps minor, a white matter tract through corpus callosum. B: Isosurface rendering of white matter showing the same fibre tract as in A (arrow).

FIG. 1 clearly shows the benefit of SENSE-sshEPI at 3 Tesla on image quality. Susceptibility-related distortion artefacts and image blurring are significantly reduced. The unfolding procedure of SENSE had no negative implication on any of the diffusion weighted images (DWIs). Fractional anisotropy (FA) maps (FIG. 2A) demonstrate the high SNR at high field even for a slice thickness of 3 mm and a relatively short total scan time (~14 min). The map's contour illustrates successful image registration. In FIG. 2B, a vector field map is shown, revealing detailed structure of tracts in the right frontal white matter. FIG. 3 depicts in two different representations the reconstructed forceps minor, a white matter fibre tract through the corpus callosum, connecting the frontal lobes of the two hemispheres.

Discussion

It has been shown that high resolution DTI at 3 Tesla is made considerably more feasible by parallel imaging. It diminishes susceptibility artefacts and image blurring, preserving the advantages of sshEPI, such as motion robustness. The high SNR at 3 Tesla and the excellent image quality of SENSE-DTI permit precise white matter fibre tracking, as demonstrated here for a single bundle. The SENSE-DTI technique together with the presented visualisation package offers a tool to investigate the connectivity between different brain areas, providing new knowledge to the understanding of neuronal networks.

Time efficiency in single-shot spiral MRI was increased by using sensitivity encoding (SENSE) for parallel data acquisition. Utilizing a six-element receiver array the spiral readout duration was reduced by a factor of two without altering demands on gradient performance. Iterative SENSE reconstruction yielded images free of aliasing artefacts. The technique was applied to functional BOLD MRI with visual, motor, and taste stimulation and compared with conventional spiral acquisition. The SENSE results showed considerably reduced artefacts in brain regions with high susceptibility gradients, which partly enabled recovery of activation in these areas. SNR and fMRI stability in SENSE were reduced by 20% and 13%, respectively.

Introduction

Spiral readout techniques are frequently used in functional brain MRI (fMRI) based on blood-oxygen-level-dependent (BOLD) contrast due to their superior motion and flow properties compared with Cartesian trajectories However, spiral acquisition is prone to artefacts and signal loss due to dephasing caused by strong susceptibility field gradients. This effect is particularly pronounced in single-shot imaging with long readout periods.

A means of improving time efficiency in MRI is parallel data acquisition with multiple receiver coils such as sensitivity encoding (SENSE). Recently, an iterative algorithm has been presented enabling efficient reconstruction of data from arbitrary trajectories. In a preferred implementation of this invention, SENSE was used to reduce the readout duration in single-shot spiral imaging. The technique was applied to BOLD fMRI. Image quality and statistical stability were compared to conventional spiral acquisition.

Methods

Single-shot spiral imaging was performed using a square field-of-view of 240 mm and a matrix size of 80×80. The readout duration of the conventional spiral trajectory was 36 ms using a maximum gradient strength of 18 mT/m and a maximum slew rate of 99 mT/m/ms. For SENSE imaging a reduction factor of R=2 was applied by reducing the sampling density in the radial direction while keeping it constant along the trajectory. This enabled a shortening of the acquisition window to 18 ms without altering the demands on the gradient peak values. The whole brain was covered with 24 axial slices of 5 mm thickness acquired every 2.5 s. Spectral-spatial excitation was applied with a flip angle of 90°. Images were acquired with a TE of 5 ms as well as 35 ms in the functional studies.

The experiments were carried out at 1.5 T on a Philips Gyroscan Intera using a receiver coil array with 6 rectangular elements of 10×20 cm$^2$. The coils were arranged around the head without overlapping adjacent elements.

Sensitivity-encoded spiral data were reconstructed using the iterative gridding approach described. The reconstruction converged after at most four iterations. The conventional spiral data were reconstructed with standard gridding but optimal complex combination of the data from multiple coils and image intensity correction. fMRI was performed in eight healthy volunteers using either visual, motor, or taste stimulation.

Figure 4:
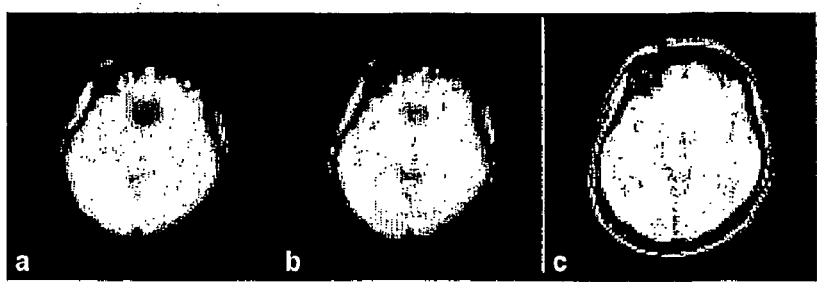
FIG. 4: Images at TE=5 ms with (a) conventional spiral, (b) spiral SENSE. (c) Gradient echo image for reference.

FIG. 4 shows images obtained with (a) conventional spiral and (b) spiral SENSE imaging acquired at TE=5 ms.

Figure 5:
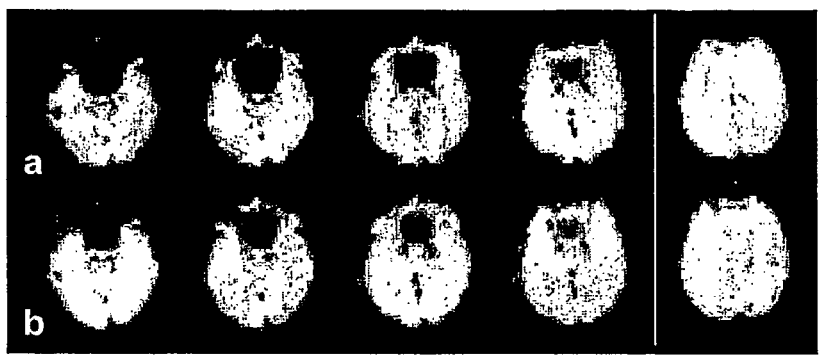
FIG. 5: Images at TE=35 ms. (a) conventional (b) SENSE

In FIG. 4a signal loss and off-resonance blurring occur in regions where strong susceptibility gradients are present, in particular in the orbito-frontal region. With SENSE (FIG. 4b) these effects are reduced considerably due to the shorter readout period. Furthermore, less blur-ring occurs from fat signal, edges are sharper, and the spatial resolution is improved due to less T2* decay. Images with TE=35 ms are shown in FIG. 5. Again the SENSE results (FIG. 2b) are superior to conventional spiral imaging (FIG. 5a). Analysis of the fMRI data of all subjects yielded a ratio of SENSE versus conventional spiral for the activation volume of 1.01×0.86 whereas in some cases SENSE enabled recovery of activation in the orbito-frontal cortex. The respective ratios for SNR and SFNR were 0.80±0.08 and 0.87±0.10.

Sensitivity encoding enables reduction of susceptibility artefacts in single-shot spiral imaging. Even though the benefit is stronger at short TE, images sensitised to BOLD contrast also show improved quality. The reduction of SNR and fMRI stability is less severe than by the theoretical value of $\sqrt{2}$ associated with the shorter acquisition time, as additional signal loss occurs in the second half of the conventional readout. Suitable applications in fMRI are studies focused on brain regions with strong susceptibility gradients such as the orbito-frontal cortex. A combination with reversed spiral acquisition and specific excitation pulses is promising. In this invention a single-shot EPI (sshEPI) sequence was combined with the parallel imaging technique SENSE in order to demonstrate fMRI with very high spatial resolution at 3 Tesla. Using an array of six receiver coils and a SENSE reduction factor of 2.7, a full 192×192 image matrix per shot was acquired, yielding an effective in-plane resolution of 1.0×1.0 mm$^2$.

The notorious problem of strong susceptibility gradients at 3 Tesla was thus mitigated both by enhanced encoding efficiency and reduced intra-voxel dephasing per unit time. As a result, motor activation was depicted with greatly enhanced spatial accuracy.

Introduction

The number of phase encoding steps in sshEPI is limited by various factors, most importantly by gradient performance and susceptibility effects. In the context of BOLD fMRI additional constraints are the prescribed optimal echo time and limited contrast-to-noise ratio (CNR). As a consequence, the spatial resolution of fMRI studies using sshEPI is usually relatively low.

In order to improve spatial resolution in fMRI, we propose combining the CNR benefit of high field strength with the parallel imaging technique SENSE. Reducing the echo train length of sshEPI, SENSE mitigates gradient and susceptibility issues and thus permits pushing spatial resolution beyond current limitations. In this invention we demonstrate high-resolution SENSE fMRI at 3 Tesla using a typical motor block paradigm.

Methods

Data Acquisition: Measurements were performed in a healthy volunteer on a Philips Intera 3.0T whole body MR unit (Philips Medical Systems, Best, The Netherlands) equipped with a TR body coil and a commercial 8-element head receiver array (MRI Devices Corporation, Waukesha Wisc., USA). Functional data were obtained from 9 transverse slices containing primary motor areas with a spatial resolution of 1.0×1.0×5 mm$^3$ (matrix size 192×192) using SENSE-sshEPI with a reduction factor of 2.7, 80% partial Fourier, TE=35 ms, and TR=2000 ms. For comparison the experiment was repeated with conventional sshEPI with otherwise the same parameters and the largest image matrix achievable at preserved TE, i.e. 112×112, corresponding to 1.6×1.6×5 mm$^3$ resolution.

Stimulus and Paradigm: Stimulation consisted of bilateral opposite finger tapping in four 20 s-on/off-periods.

Figure 6:
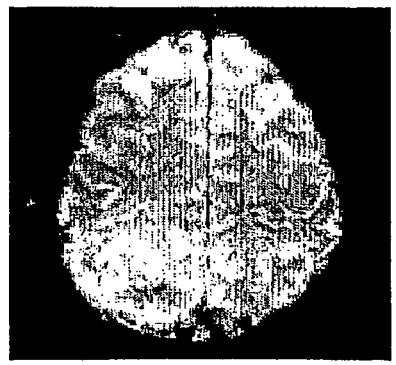
FIG. 6: Left: High-resolution sshEPI fMRI using SENSE. Activated pixels are coloured white. Right: Conventional sshEPI fMRI. Note improved spatial detail and reduced distortion in the high resolution data. Bottom row: enlarged detail
Figure 6:
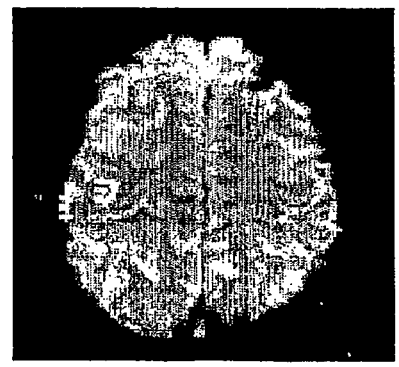
Figure 6:
Figure 6:
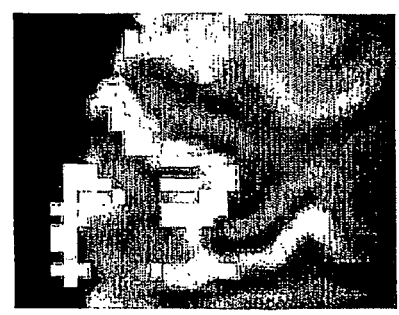
Figure 7:
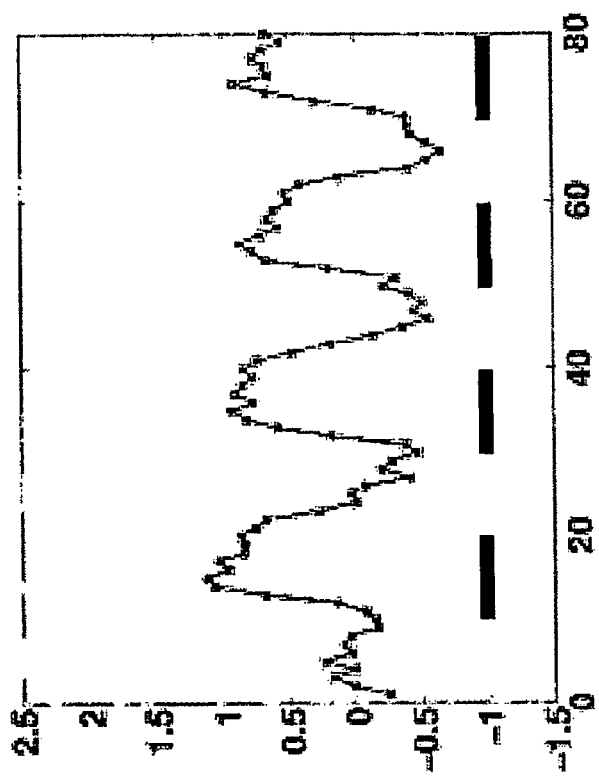
FIG. 7: Relative signal time courses averaged over activated area. Right: High-resolution SENSE sshEPI Left: Conventional sshEPI. Vertical bars indicate the stimulation periods.
Figure 7:
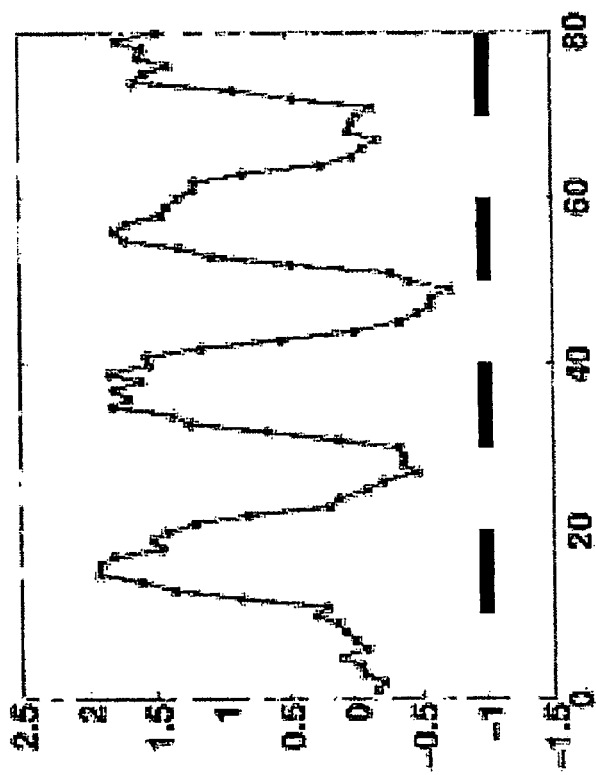

Postprocessing: Data were motion corrected and a linear drift correction was applied to the signal time courses. A statistical threshold of p<0.0001 was chosen to hig Results The resulting BOLD activation maps are displayed in FIG. 6, overlaid to sshEPI images taken from the dynamic series. The improved detail of the high resolution image is readily appreciated. It also exhibits slightly reduced susceptibility artefact as compared with the conventional image. Both experiments yielded activation focused in the motor area, with the left-right bias stemming mainly from a slight tilt of the head. There is excellent agreement between the activated regions in the two maps. However, due to higher resolution the activation in the SENSE case reflects the underlying gyri more accurately. The total activated area is 16% smaller in the high resolution map, most probably due to less partial volume effect. Signal time courses averaged over the activated area are displayed in FIG. 7 illustrating that the CNR was still sufficent for correlation analysis at high resolution. The percent signal change was even somewhat higher in the SENSE experiment.

Discussion

This study demonstrates that the speed benefit of parallel imaging permits trading the SNR advantage of high field for higher resolution. CNR permitting, improved spatial resolution is of great interest especially for advanced MRI studies, focusing on details of cortical functional topography.

Susceptibility effects, which increase with field strength, are reduced not only by SENSE acquisition but also by reducing voxel size. As a result, the high resolution data presented exhibit less susceptibility artefact than the conventional data Slight reduction in the activated area is probably related to reduced partial volume effect. Partial volume effect may also partly underlie the increase in percent signal change observed in the high resolution experiment. However, this effect requires more detailed investigation, as it may as well be related to pixels with low activation, which are detected only in the low resolution case with higher CNR, lowering the average activation there.

Figure 8:
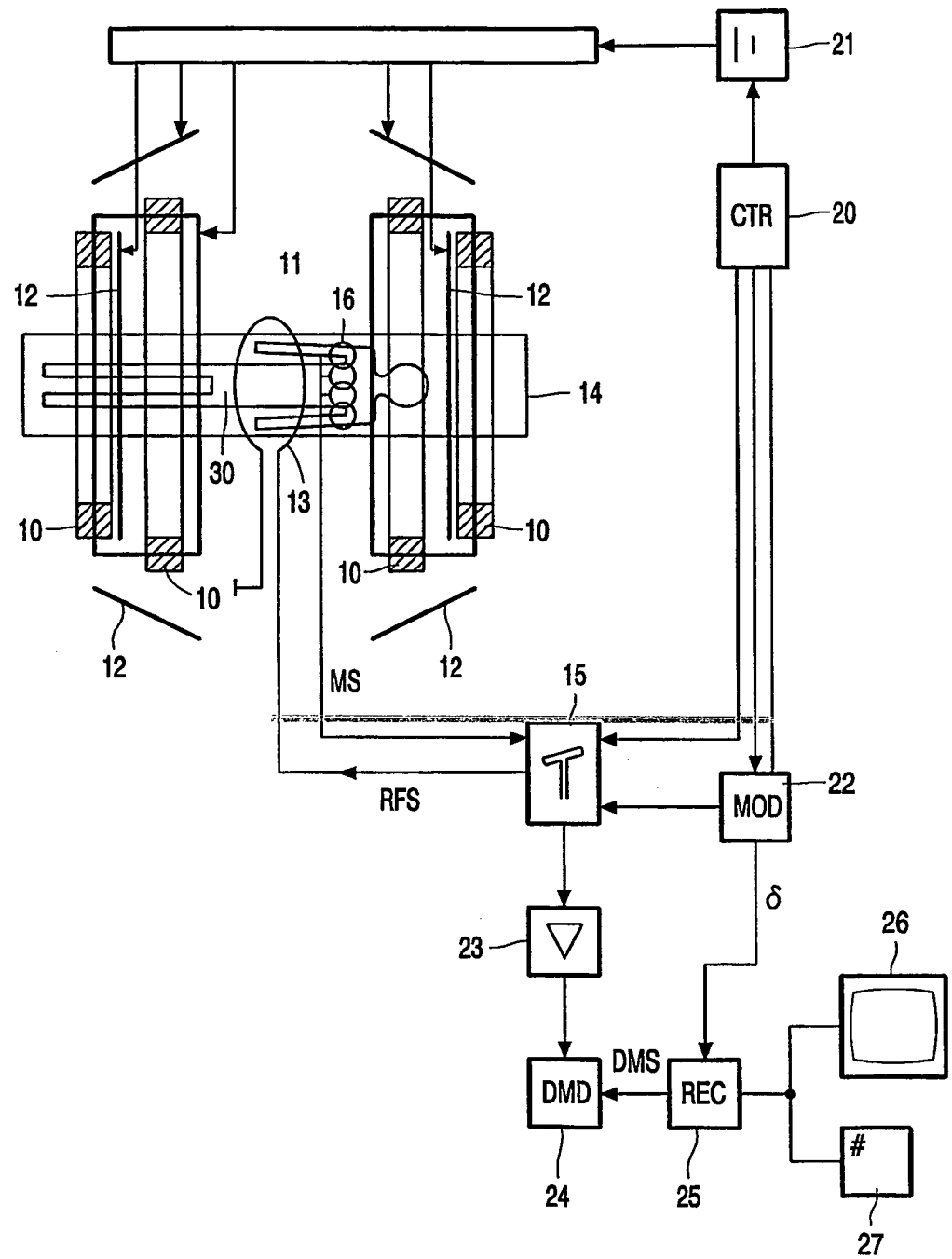
FIG. 8 shows diagrammatically a magnetic resonance imaging system in which the invention is used.

FIG. 8 shows diagrammatically a magnetic resonance imaging system in which the invention is used.

The magnetic resonance imaging system includes a set of main coils 10 whereby the steady, uniform magnetic field is generated. The main coils are constructed, for example in such a manner that they enclose a tunnel-shaped examination space. The patient to be examined is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21. The gradient coils 11, 12 are energized by application of an electric current by means of the power supply unit 21. The strength, direction and duration of the gradients are controlled by control of the power supply unit. The magnetic resonance imaging system also includes transmission and receiving coils 13, 16 for generating the RF excitation pulses and for picking up the magnetic resonance signals, respectively. The transmission coil 13 is preferably constructed as a body coil whereby (a part of) the object to be examined can be enclosed. The body coil is usually arranged in the magnetic resonance imaging system in such a manner that the patient 30 to be examined, being arranged in the magnetic resonance imaging system, is enclosed by the body coil 13. The body coil 13 acts as a transmission aerial for the transmission of the RF excitation pulses and RF refocusing pulses. Preferably, the body coil 13 involves a spatially uniform intensity distribution of the transmitted RF pulses. The receiving coils 16 are preferably surface coils 16 which are arranged on or near the body of the patient 30 to be examined. Such surface coils 16 have a high sensitivity for the reception of magnetic resonance signals which is also spatially inhomogeneous. This means that individual surface coils 16 if are mainly sensitive for magnetic resonance signals originating from separate directions, i.e. from separate parts in space of the body of the patient to be examined. The coil sensitivity profile represents the spatial sensitivity of the set of surface coils. The receiving coils, notably surface coils, are connected to a demodulator 24 and the received magnetic resonance signals (MS) are demodulated by means of the demodulator 24. The demodulated magnetic resonance signals (DMS) are applied to a reconstruction unit. The reconstruction unit reconstructs the magnetic resonance image from the demodulated magnetic resonance signals (DMS) and on the basis of the coil sensitivity profile of the set of surface coils. The coil sensitivity profile has been measured in advance and is stored, for example electronically, in a memory unit which is included in the reconstruction unit. The reconstruction unit derives one or more image signals from the demodulated magnetic resonance signals (DMS), which image signals represent one or more, possibly successive magnetic resonance images. This means that the signal levels of the image signal of such a magnetic resonance image represent the brightness values of the relevant magnetic resonance image. The reconstruction unit 25 in practice is preferably constructed as a digital image processing unit 25 which is programmed so as to reconstruct the magnetic resonance image from the demodulated magnetic resonance signals and on the basis of the coil sensitivity profile. The digital image processing unit 25 is notably programmed so as to execute the reconstruction in conformity with the so-called SENSE technique or the so-called SMASH technique. The image signal from the reconstruction unit is applied to a monitor 26 so that the monitor can display the image information of the magnetic resonance image (images). It is also possible to store the image signal in a buffer unit 27 while awaiting further processing, for example printing in the form of a hard copy.

In order to form a magnetic resonance image or a series of successive magnetic resonance images of the patient to be examined, the body of the patient is exposed to the magnetic field prevailing in the examination space. The steady, uniform magnetic field, i.e. the main field, orients a small excess number of the spins in the body of the patient to be examined in the direction of the main field. This generates a (small) net macroscopic magnetization in the body. These spins are, for example nuclear spins such as of the hydrogen nuclei (protons), but electron spins may also be concerned. The magnetization is locally influenced by application of the gradient fields. For example, the gradient coils 12 apply a selection gradient in order to select a more or less thin slice of the body. Subsequently, the transmission coils apply the RF excitation pulse to the examination space in which the part to be imaged of the patient to be examined is situated. The RF excitation pulse excites the spins in the selected slice, i.e. the net magnetization then performs a precessional motion about the direction of the main field. During this operation those spins are excited which have a Larmor frequency within the frequency band of the RF excitation pulse in the main field. However, it is also very well possible to excite the spins in a part of the body which is much larger than such a thin slice; for example, the spins can be excited in a three-dimensional part which extends substantially in three directions in the body. After the RF excitation, the spins slowly return to their initial state and the macroscopic magnetization returns to its (thermal) state of equilibrium. The relaxing spins then emit magnetic resonance signals. Because of the application of a read-out gradient and a phase encoding gradient, the magnetic resonance signals have a plurality of frequency components which encode the spatial positions in, for example the selected slice. The k space is scanned by the magnetic resonance signals by application of the read-out gradients and the phase encoding gradients. According to the invention, the application of notably the phase encoding gradients results in the sub-sampling of the k space, relative to a predetermined spatial resolution of the magnetic resonance image. For example, a number of lines which is too small for the predetermined resolution of the magnetic resonance image, for example only half the number of lines, is scanned in the k space.

The invention has been described with reference to the preferred embodiments. Modifications and alterations may occur to others upon reading and understanding the preceding detailed description. It is blended that the invention be constructed as including all such modifications and alterations insofar as they come within the scope of the appended claims or the equivalents thereof.

The invention claimed is:

1. A magnetic resonance imaging method comprising:
    applying a static main magnetic field with a main field strength;
    applying an acquisition sequence with an RF-excitation which generates an echo train of successive magnetic resonance signals from an object to be examined, the acquisition sequence including a diffusion sensitization subsequence;
    receiving the magnetic resonance signals with a degree of undersampling by means of a receiver antennae system having a spatial sensitivity profile, the degree of undersampling is set on the basis of an amount of phase evolution due to a magnetic susceptibility distribution of the object to be examined;
    reconstructing a magnetic resonance image from the magnetic resonance signals and the spatial sensitivity profile;
    repeatedly applying the excitation sequence, receiving the magnetic resonance signals and reconstructing the magnetic resonance image to produce a series of magnetic resonance images;
    matching said magnetic resonance images and determining mutual matches between said magnetic resonance images;
    selecting a number of the magnetic resonance images from the series on the basis of the mutual matches;
    averaging over said selected number magnetic resonance images.

2. A magnetic resonance imaging method as claimed in claim 1, wherein the degree of undersampling is dependent on the main field strength.

3. A computer processor or media programmed to perform the steps of:
    repeatedly applying an excitation sequence, receiving resultant magnetic resonance signals, and reconstructing the magnetic resonance signals to produce a series of magnetic resonance images;
    comparing the magnetic resonance images of the series to determine images with at least a preselected degree of similarity;
    combining the magnetic resonance images of the series which have at least the preselected degree of similarity.

4. A magnetic resonance imaging system including a main magnet which applies a static magnetic field, an RF coil, a transmitter for applying an acquisition sequence with an RF excitation which generates an echo train of successive magnetic resonance signals from an object to be examined, a receiver antenna system having a spatial sensitivity profile, a receiver for receiving magnetic resonance signals from the receiver antenna system, and the computer processor media as claimed in claim 3.

5. A magnetic resonance imaging system including a main magnet which applies a static magnetic field, an RF coil, a transmitter for applying an acquisition sequence with an RF excitation which generates an echo train of successive magnetic resonance signals from an object to be examined, a receiver antenna system having a spatial sensitivity profile, a receiver for receiving magnetic resonance signals with a degree of undersampling from the receiver antenna system, and a controller, the controller being programmed to:
    selectively adjust the degree of undersampling in accordance with an amount of phase evolution artifacting attributable to a magnetic susceptibility distribution of the object to be examined.

6. The apparatus as claimed in claim 5 further including a reconstruction processor programmed to:
    repeatedly apply the excitation sequence, receive the magnetic resonance signals, and reconstruct the magnetic resonance signals to produce a series of magnetic resonance images;
    compare the magnetic resonance images of the series to determine images with at least a preselected degree of similarity;
    combine the magnetic resonance images of the series which have at least the preselected degree of similarity.

* * * * *